(12) United States Patent
Teich

(10) Patent No.: US 6,954,076 B2
(45) Date of Patent: Oct. 11, 2005

(54) AIRCRAFT MULTI-FUNCTION WIRE AND INSULATION TESTER

(75) Inventor: Stanley Teich, New York, NY (US)

(73) Assignee: Northrop Grumman Corporation, Los Angeles, CA (US)

( * ) Notice: Subject to any disclaimer, the term of this patent is extended or adjusted under 35 U.S.C. 154(b) by 368 days.

(21) Appl. No.: 10/236,790

(22) Filed: Sep. 6, 2002

(65) Prior Publication Data

US 2004/0046570 A1 Mar. 11, 2004

(51) Int. Cl.⁷ .............................................. H01H 31/02
(52) U.S. Cl. ........................ 324/540; 324/533; 324/541
(58) Field of Search ................................. 324/533, 527, 324/535, 534, 540, 541, 539; 702/108

(56) References Cited

U.S. PATENT DOCUMENTS

| | | | |
|---|---|---|---|
| 5,128,619 A | 7/1992 | Bjork et al. ................. | 324/533 |
| 5,479,610 A | 12/1995 | Roll-Mecak et al. .......... | 714/25 |
| 5,530,367 A | 6/1996 | Bottman ..................... | 324/616 |
| 5,903,156 A | 5/1999 | Matsumaru et al. ........ | 324/533 |
| 5,977,773 A | 11/1999 | Medelius et al. ........... | 324/520 |
| 6,195,614 B1 | 2/2001 | Kochan ........................ | 702/66 |
| 6,266,395 B1 | 7/2001 | Liu et al. .................. | 379/27.01 |
| 6,285,195 B1 | 9/2001 | Needle ......................... | 324/584 |
| 6,341,159 B1 | 1/2002 | Jollota ..................... | 379/22.03 |
| 6,385,561 B1 | 5/2002 | Soraghan et al. ........... | 702/185 |
| 6,389,109 B1 | 5/2002 | Schmidt et al. ............ | 379/1.04 |
| 6,397,159 B1 | 5/2002 | Richardson ................. | 702/79 |
| 6,417,672 B1 | 7/2002 | Chong ......................... | 324/520 |
| 6,442,498 B1 * | 8/2002 | Krigel ........................ | 702/108 |
| 2002/0125891 A1 * | 9/2002 | Allan et al. ................. | 324/534 |

* cited by examiner

Primary Examiner—Anjan Deb
(74) Attorney, Agent, or Firm—Stetina Brunda Garred & Brucker

(57) ABSTRACT

An aircraft multi-function wire and low voltage insulation tester, having a time domain reflectometer, a digital multi-meter, and a matrix switch integrated in a computer, and a connector having a plurality of output pins allowing a plurality of wires to be hooked up simultaneously. The matrix switch connects the output pins to either the digital multi-meter or the time domain reflectometer perform the respective tests. Corresponding to the output pins, the matrix switch has a plurality of input/output channels, such that wire paths can be established between the output pins. The time domain reflectometry and characteristic tests can thus be performed on each line of a cable to be tested, and each wire path established between the output pins or the lines.

20 Claims, 7 Drawing Sheets

AIRCRAFT MULTI-FUNCTION WIRE AND INSULATION TESTER

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to an aircraft multi-function wire and insulation tester (AMWIT), and more particularly to an aircraft multi-function wire insulation tester with a time domain reflectometer (TDR) a digital multi-meter and matrix switch integrated in a rugged computer for testing cables and harnesses of aircraft.

Failure detection and isolation for complex system such as aircraft are still difficult to perform without complete removal of the interface cables and other components from the system for testing. Removal and replacement of cables are time-consuming and costly, and can be particularly disadvantageous in combat situations.

Testing device such as TDR has been developed to test one line at a time. Conventional TDR does not provide TDR testing on multiple lines hooked up at one time. It also does not provide for insulation testing on single or multiple lines. Other testing devices such as cable analyzers can test multiple lines, however they require that both ends of the cable under test be connected to the analyzer. This is very often difficult for gaining access to both ends of a cable or removal or a cable that is installed in an aircraft. Existing cable analyzers that have the capability to test insulation use high voltage to make these measurements. This can stress or be destructive to the wiring under test.

SUMMARY OF THE INVENTION

The present invention provides an aircraft multi-function wire and insulation tester. The aircraft multi-function wire and insulation tester comprises a time domain reflectometer, a digital multi-meter, and a matrix switch integrated in a computer, and a connector having a plurality of output pins allowing a plurality of wires to be hooked up simultaneously and a single BNC connector used for manual testing. The matrix switch connects the output pins or BNC connector to either the digital multi-meter or the time domain reflectometer perform the respective tests.

When the output pins are connected to the time domain reflectometer via the matrix switch, the time domain reflectometry tests are automatically performed on each of the lines connected to the output pins, and each of the wire path established between every two lines of the cable to be tested. Similarly, when the output pins are connected to the digital multi-meter via the matrix switch, characteristic measurements including voltage, current, leakage current, 2 wire or 4 wire resistance, capacitance, inductance and insulation resistance can be performed on each line and each wire path. Leakage current and insulation resistance will characterize insulation properties of wire under test. The present invention does not only provide tests on each line of a cable, but also provides tests performed on the wire path between the lines and between every line and ground.

The aircraft multi-function wire and insulation tester further comprises a graphic user interface providing a main menu allowing a user to select an operation mode (automatic or manual) and test function displaying current operation status thereof. The main menu and the operation status can be displayed on a display. The user can then select between an automatic operation mode or a manual operation mode to perform the tests.

When a cable with N lines are connected to the connector, that is, lines W1 to WN are hooked up to the output pins of the connector, $N \times (N-1)/2$ wire paths are established. In the manual operation mode, the user can select among any pair of the possible wire paths between the wires or any wire and ground to perform tests thereon. Preferably, the matrix switch also include N input/output channels corresponding to the N output pins.

When the automatic operation mode is selected, a software routine is called up. By executing the software, tests are performed on all the wires and wire paths automatically. When the manual operation mode is selected, various graphic menu are called up in various operation testing stages, allowing the user to select the required test performed on the required wire and/or wire path.

The time domain reflectometer is operative in two modes. First it locates distance to fault for short circuits and open circuits. Then it switches to a special mode where it is operative to amplify a baseline of a time domain reflectometry waveform obtained from a cable under test, such that a chafe is detected and located by detecting any pip over a preset threshold level above the baseline. The threshold level is automatically set to a preset level derived from experiments with chafed wines. In addition, the digital multi-meter further includes a function generator for generating AC or DC function signal to the cable or device of the aircraft. In addition, the DMM includes the measurement of frequency and pulse width on any pins of the cable under test.

The present invention further provides a method of testing a cable comprising a plurality of lines comprising the following steps. One end of each line of the cable is connected to a time domain reflectometer, allowing time domain reflectometry test performed on each line of the cable and each wire path established between every two of the lines of the cable. In one embodiment of the present invention, the time domain reflectometry and characteristic tests are further performed on wire paths established between the lines and ground. The end of each line is then automatically connected to a digital multi-meter to perform characteristic capacitance inductance test on each of the lines and each wire path.

The above method further comprises a step of performing a low voltage insulation measurement on each wire path, where the applied low voltage is no larger than 10VDC. In this mode, the DMM is connected to each wire pair tested and performs insulation resistance and leakage current measurements to characterize the insulation properties of the wires tested. The high accuracy properties of the DMM allow it to perform current measurements at a very low level (1 nano amp typical) using low voltage.

The method provided by the present invention further provides the measurement of velocity of signal propagation and dielectric constant of the cable to be tested. First of all, the length D of the cable to be tested is obtained. The time T for detecting an open circuit at and end of the cable is counted. The velocity of signal Vp is thus calculated by $D = C \times Vp \times T$, where C is the speed of light. As the velocity of signal propagation is a function of dielectric constant, the dielectric constant can be derived therefrom. This technique is a claim of a separate patent disclosure, "Dielectric Cable Analyzer Software" by Teich & Frank. AMWIT provides this function but does not claim it as an original function.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
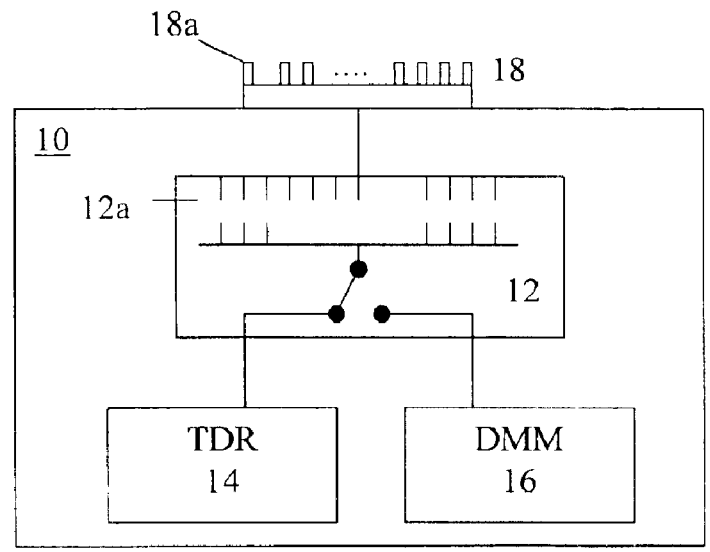
FIG. 1 is a functional block diagram of an aircraft multi-function wire and insulation tester according to the present invention.

FIG. 1 shows a functional block diagram of portable aircraft multi-function wire and insulation tester (AMWIT) provided by the present invention. The multi-function wire and insulation tester comprises a time domain reflectometer (TDR) 14, a digital multi-meter (DMM) 16, and a multi-line input/output (I/O) matrix switch 12 integrated in a rugged computer 10, and connectors 18 or 35 to be hooked up with harnesses or cables to be tested. The connector 18 further includes a plurality of output pins 18a allowing a plurality of lines, cables or wires hooked up to the tester at the same time. Connecter 35 is a BNC connector used for manual testing. The matrix switch 12 also comprises a plurality of input/output channels 12a with one ends connected to the corresponding output pins 18a, and the other ends connected to either the time domain reflectometer 14 or the digital multi-meter 16. That is, the matrix switch 12 switches the connection of the connector 18 between the time domain reflectometer 14 and the digital multi-meter 16.

Figure 2:
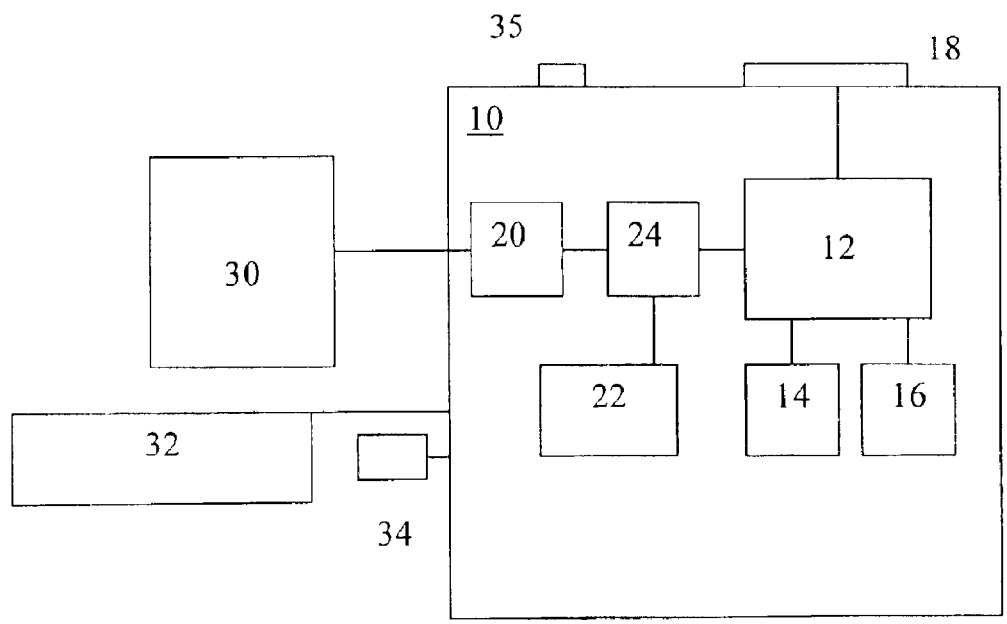
FIG. 2 shows the additional features of the aircraft multi-function wire and insulation tester as shown in FIG. 1.

The computer 10 includes a personal computer, preferably a laptop computer. As shown in FIG. 2, in addition to the devices as shown in FIG. 1, the AMWIT further comprise a processor 24, a graphic interface unit 20, a software, a color display 30, and input apparatus 32 and/or 34. The graphic interface unit 20 provides a graphic menu allowing the user to select the operation mode, that is, the manual testing mode or automatic testing mode, or test function and provides graphic information of the current operation status of the AMWIT. The graphic menu or the graphic information of the current operation is shown on the display 30. In this embodiment, the input apparatus 32 includes a keyboard, and the input apparatus 34 includes a mouse. Other input apparatus allowing the user to input information or command to the personal computer 10 can also be applied without exceeding the spirit and scope of the present invention.

In the conventional cable analyzer tester, both ends of every wire in a cable have to be hooked up to two respective output pins 18a of the connector 18. In the present invention, each wire can be tested by hooking only one end thereof to one output pin 18a of the connector 18. When the matrix switch 12 is connected to the time domain reflectometer 14, the fault detection and location of the cable can be performed. The time domain reflectometry test (TDR test) of a single wire is incorporated by reference to U.S. Pat. No. 5,479,610. "System Interface Faulty Isolator Test" and U.S. patent application Ser. No. "Method and System for Analyzing Cable Faults" filed at Oct. 6, 2000 by Frank, et al. When the matrix switch 12 is switched to the digital multi-meter 16, tests on characteristic such as resistance, capacitance, inductance, and leakage current (DMM tests) can also be performed by hooking up only one end of the wire to one output pin 18a of the connector 18. The method for testing only short circuits of a single wire by single-ended connection is incorporated by reference to the U.S. patent application Ser. No. "Smart AWA" filed at Sep. 26, 2001 by the same inventor of the current application. In addition, the AMWIT can measure voltage, current, frequency and pulse width from one end of a cable when the other end is connected to active circuitry in an aircraft system.

In addition to the single-wire tests, the AMWIT provided by the present invention can also perform TDR tests and DMM tests for a plurality of wires or a plurality of wire paths formed by a plurality of pairs of wires hooked up thereto. That is, as the connector 18 includes a plurality of output pins 18a and the matrix switch 12 has a plurality of input/output channels 12, a plurality of wires can be connected to the TDR tester 14 or the DMM 16 at the same time.

In one embodiment of the present invention, the connector 18 includes 60 output pins; and preferably, the matrix switch 12 also includes 60 input/output channels 12a. When two wires w1 and w2 are connected to two respective 60 output pins 18a, a wire path w1–w2 is established between the two output pins 18a, and TDR and DMM tests can be performed on the wires w1, w2, and along the wire path w1–w2. When three wires w1, w2 and w3 are connected to any three of the output pins 18a, three wire paths including w1–w2, w2–w3, and w1–w3 are established. The TDR and DMM tests can thus be performed on the wires w1, w2, w3, and the wire paths w1–w2, w2–w3, and w1–w3. When 60 wires w1 to w60 are connected to respective output pins 18a in a single-end connection manner, 60×(60−1)/2=1770 wire paths w1–w2 to w59–w60 are established, and tests can be performed on each of the wires w1 to w60, and to the wire paths w1–w2 to w59–w60, that is, on each pair of the wires w1 to w60.

In addition to the above wire paths between the wires to be tested, TDR test and DMM test can also be performed along the wire path established between any wire w1–w60 to the ground. It will be appreciated that the number of the output pins 18a and I/O connectors 12a is not limited to 60, but can be expanded or modified according to specific requirement.

Before performing any TDR test on a cable to be tested, a known-good cable is hooked up to the connector 18. The TDR waveforms of the known-good cable for all combinations of signal pairs, that is, the TDR waveforms obtained along all the wire paths w1–w2 to w59–w60 by are pre-stored. For short-circuit detection, the cable to be connected to be tested is hooked up to the connector, and TDR waveforms of the cable is obtained and compared to the stored TDR waveforms, such that any short circuit between the lines of the cable can be detected. For open-circuit detection, the length of the cable to be tested is first calculated by detecting a length of the maximum open-circuit waveform in all signal pair combinations. Any other TDR open circuit waveform conformal to this length within a tolerance is considered normal, since all lines of a cable under test with the other end disconnected will look like an open. If an open circuit is detected where the length is smaller than the length of the cable under test, then an open circuit failure with a corresponding distance to fault is detected.

The time domain reflectometer 14 also provides the function to test and determine the velocity coefficient of propagation Vp and dielectric constant k of any wire of a specific length, where Vp is a function of k. This is done by obtaining a distance D of a known-good wire the same as the wire to be tested. By operating the TDR test in the time mode, a relationship between the distance D, the velocity of signal propagation, and the time T to find open circuit of the cable to be tested is expressed as:

Distance ($D$)=velocity of signal propagation×Time

Velocity of signal propagation=Speed of light×$Vp$ (Velocity coefficient of propagation), or $D$ (meters)=$C$ (3×10$^8$ meters/sec)×$Vp$×Time Since the distance D of the sample cable is known, the time T to find the open circuit of the cable to be tested can be counted, the velocity coefficient of propagation can be derived from the above relationship. As the velocity of signal propagation Vp is a function of the dielectric constant, the dielectric constant of the wire to be tested can also be obtained.

Figure 3A:
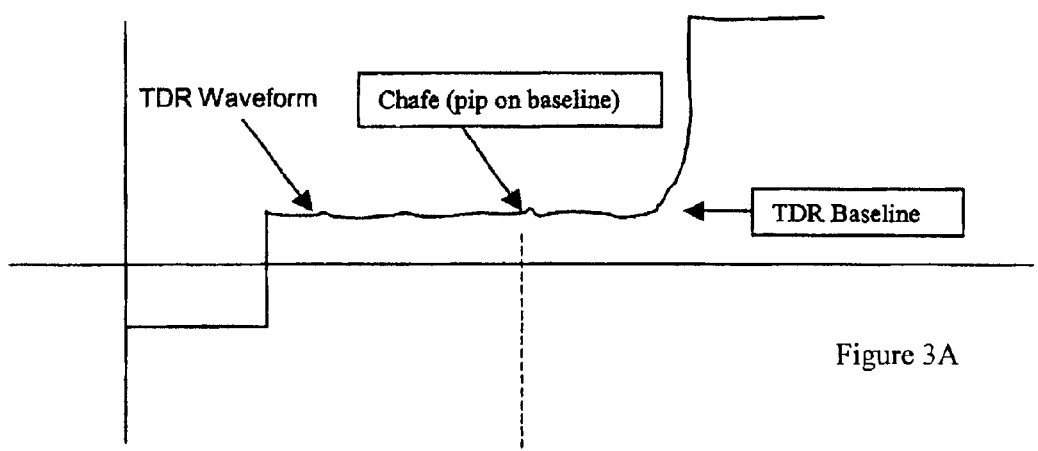
FIG. 3A shows a time domain reflectometry waveform obtained from a cable under test.
Figure 3B:
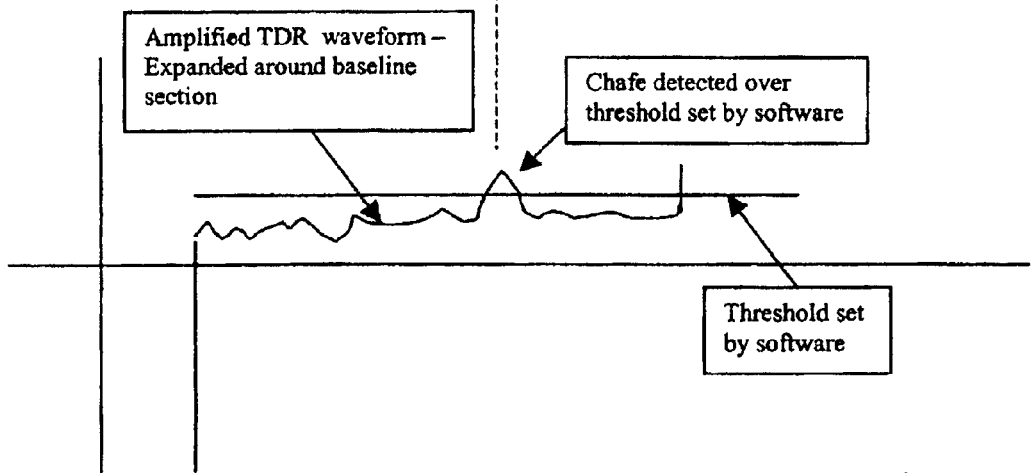
FIG. 3B shows the amplification of the baseline of the waveform as shown in FIG. 3A.

The time domain reflectometer 14 further comprises the function of detecting chafes and other detects in wiring by feature extraction of the TDR waveform. FIGS. 3A shows the TDR waveform of measured from an exemplary wire with ½-inch chafe. As known to those skill in the art, the TDR waveform includes a baseline region as shown in FIG. 3A. In this embodiment, a small pip appears in the baseline region of the TDR waveform. This small pip indicates a potential chafe or defect, or the result of natural defect. Therefore, the TDR waveform is compared to a pre-stored reference TDR waveform for a known-good wire, and a threshold value (based on empiracle data for wire with chafes) is determined. The pip appears under the threshold value caused by environment noise is ignored or eliminated from consideration. As a result, only the pip over the threshold value is considered caused by real chafe. However, referring to FIG. 2A, the pip is often insignificant and difficult to discriminate. Therefore, in the present invention, the baseline region of the TDR waveform is amplified as shown in FIG. 2B; and consequently, the pip over the threshold valve is amplified and can be detected and located.

When the matrix switch 12 is switched to the digital multi-meter 16, characteristic measurements can be performed. Similar to the TDR tests, the characteristic measurements are performed along each wire w1 to w60, as well as the possible wire path, such as w1–w2, w1–23, . . . , to w59–w60, depending on the hook-up condition of each output pin 18a. In addition to the typical characteristic measurement, the AMWIT further provides the insulation test between the wires hooked up to respective output pins 18a. The insulation test can be performed by comparing the measurement obtained from a cable to be tested to the measurement obtained from a known-good cable. Under the normal condition, the individual cables or wires are insulated from each other to constitute an open loop with specific values for leakage current and insulation resistance. When insulation damage or deterioration is present between specific wire paths, the insulation resistance and leakage current between the wires is thus changed to an abnormal value. In this manner, the insulation test can be performed in a non-destructive way with the application of a low voltage equal to 10V. In the present invention, insulation up to 1000 Megaohms can be measured. Similarly, the leakage current as low as 1 nanoampere can be detected by the AMWIT provided by the present invention.

In addition to the above measurement, the digital multi-meter 14 may further includes an AC or DC voltage generator to provide power to the cable hooked up to the connector 18, or devices connected to the AMWIT. In addition, timing characteristics including the frequency, the period, pulse width and the event counter of a signal generated from the connected device can also be measured.

In one embodiment of the present invention, the AMWIT design comprises 4 PCI cards housed in a lunch-box style PC. The PCI cards include a TDR card, a DMM card, and two switch cards uniquely wired to form a matrix switch.

Figure 4:
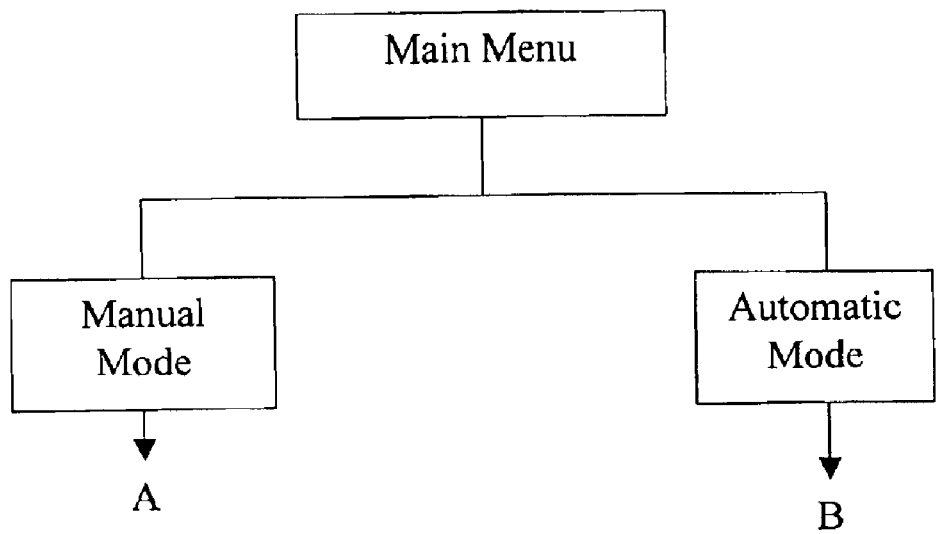
FIG. 4 shows the operation mode of the aircraft multi-function wire and insulation tester provided by the present invention.

The operation of the AMWIT can be controlled manually by the user or automatically by a software 30 as shown in FIG. 2. When the AMWIT is activated, a main menu is shown on the display 30 via the graphic interface unit 20. As shown in FIG. 4, the main menu includes two options, that is, the manual mode A and automatic mode B. The user can thus selects to perform the tests manually or automatically by inputting the selection via the input apparatus 32 or 34. In the manual operation mode, the user can select the output pins 18a to be connected, the wires to be tested, and the tests to be performed step by step. When an automatic operation mode is selected, or without any input of the user, the automatic operation can be set to run all AMWIT measurements on all combinations of output wire paths automatically.

Figure 5:
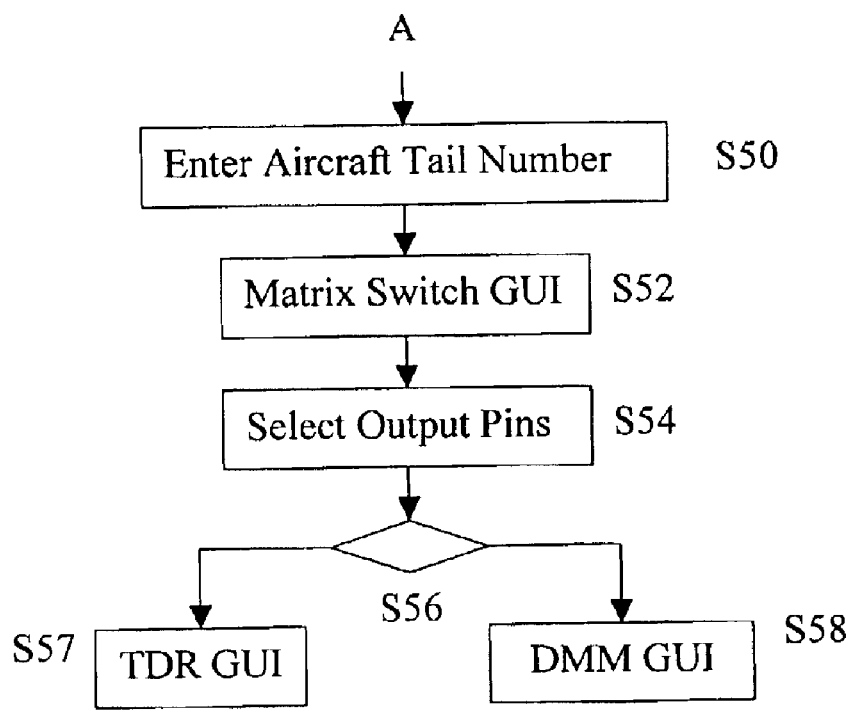
FIGS. 5, 5A and 5B shows manual operation of the aircraft multi-function wire and insulation tester provided by the present invention.
Figure 5A:
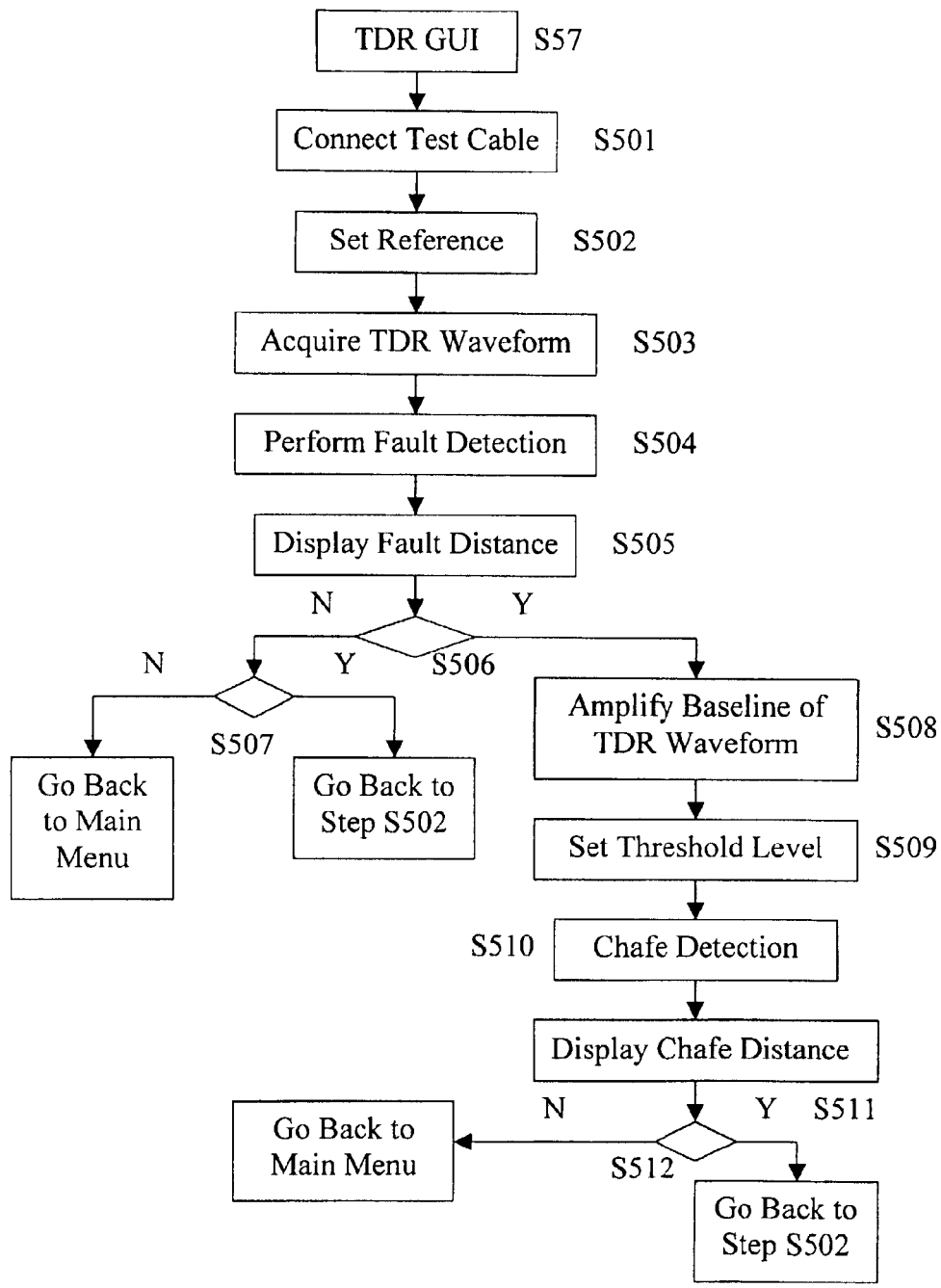
Figure 5B:
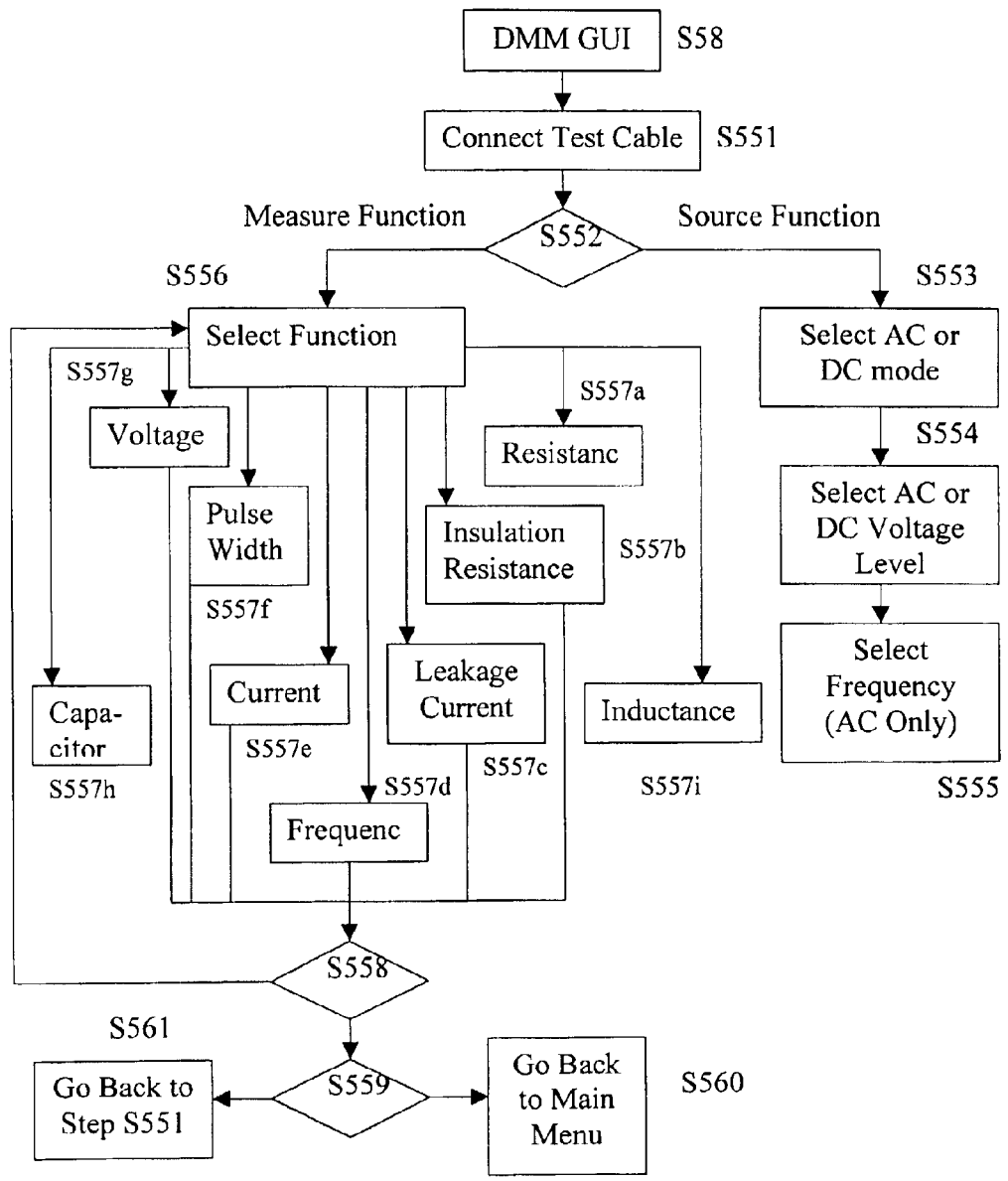

FIGS. 5, 5A and 5B show the process flow of the manual operation mode. In step S50, the identity information such as the aircraft tail number can be input as a reference. In step S52, the matrix switch 12 is shown on the display 30, allowing the user to switch the connection between the TDR tester 14 and the DMM tester 16. That is, the user can select performing TDR tests or characteristic tests via the input apparatus 32 or 34. When the display 30 is a touch-panel, the user can directly select the TDR tests or the characteristic tests by touching the icons presenting the TDR tests and the DMM tests as shown on the display 30. In step S54, the output pins 18a to be connected to the TDR tester 14 or the DMM tester are selected. For example, when a cable having two lines is to be tested, two of the output pins 18a are selected and connected to the TDR tester 14 or the DMM tester 16 via the matrix switch 12. When the TDR tests are selected in step S56, a TDR test menu is shown on the display 30 via the graphic interface unit 20 in step S57, followed by the TDR process flow as shown in FIG. 5A. When the DMM tests are selected in step S58, a DMM test menu is shown on the display 30, followed by the DMM test process flow as shown in FIG. 5B.

In FIG. 5A, when the TDR tests are selected under the manual operation mode and the TDR tester is connected to the output pins 18a, the cable to be tested is hooked up to selected output pins in step S501. In Step S502, a reference point of the cable to be tested to an end thereof is set. In step S503, the TDR waveform of the cable under test is obtained. After obtaining the TDR waveform of the cable under test, the cable fault such as open circuit or a short circuit is detected and located in step S504. In step S505, the distance of the fault is shown on the display 30. In one Preferably, the computer 10 or the AMWIT further comprises a memory or recording medium for storing the test results of the AMWIT for various aircraft. For example, in addition to be shown in the display 30, the distance of the fault may also be kept in the memory or recording medium in step S505 until the fault is mended. After the TDR test is performed on the cable to be tested, the user may decide whether chafe detection is performed. If the user decides that the chafe detection is not required in step S506, the process goes to step S507. In step S507, if another wire or wire path of the cable is to be tested, the process goes back to step S502 to perform TDR test on another wire or along another wire path. The process from steps S502 to S507 are repeated until all the wires and wire paths of the cable have been tested. If all the wires connected to the connector 18 and all the wire paths have been tested, the main menu is shown on the display 30 allowing other type of test operation to be performed, or the same type of tests to be performed on other cable.

In FIG. 5A, when the user selects to perform feature extraction of the TDR waveform in step S506, the TDR waveform of the cable to be tested is obtained. The baseline of the TDR waveform of the cable to be tested is amplified in step S508. In step S509, a threshold level of the baseline is set up, such that any pip over the threshold level can be detected as the potential chafe in step S510. In step S510, not only the existence of the pip, that is, the potential chafe can be detected, the location of the chafe distance can also be detected. In step S511, the distance of the chafe is located from the TDR waveform. In step 512, the user can decide whether there are any other wires or wire paths along which the TDR test is performed. If no further wire path is tested, or all the combinations of wires have been tested, the process goes back to the main menu. If there are some other wires or wire paths to be tested, the process goes back to step S502 to repeat the same test schedule.

Referring to FIG. 5, when DMM tests are selected to perform on the cable to be tested, the selected output pins 18a are connected to the DMM tester in step S56, followed by the process flow as shown in FIG. 5B. As shown in FIG. 5, the cable to be tested is connected to the connector 18 in steps S521 after the DMM tester 16 is connected to the selected output pins 18a via the matrix switch 12. In step S552, the user may select to apply the DMM tester 16 as a multi-meter or a function generator. When the DMM tester 16 is used as a function generator, the operation mode, that is, AC mode or DC mode is selected in step S553. After the operation mode is selected, the applied voltage level is selected in step S554, and the frequency of the applied voltage is selected in step S555. When the DMM tester is used as a characteristics tester, the characteristic to be tested is selected in step S556, and the selected characteristics are tested in steps S557a to S557g. The characteristic measurements include resistance measurement (step S557a), insulation resistance measurement (step S557b), leakage current measurement (step S557c), frequency measurement (step S557d), current measurement (step S557e), pulse width measurement (step S557f), and voltage measurement (step S557g) capacitance measurement and inductance measurement. After the selected measurement is performed on the connected cable in steps S557a to S557g, whether other measurement is performed on the same cable is determined in step S558. If no other measurement is performed, whether any other wire path or cable is tested is determined in step S559. If no other wire path or cable is to be measured, the process goes back to the main menu as shown in FIG. 4. If other wire path or cable is to be measured, the process goes back to step S551 to repeat the same processes for various measurements. If the user decides to perform other measurement on the same cable in step S558, the process goes back to step S556 to repeat the similar process until all the required measurements are performed.

Figure 6:
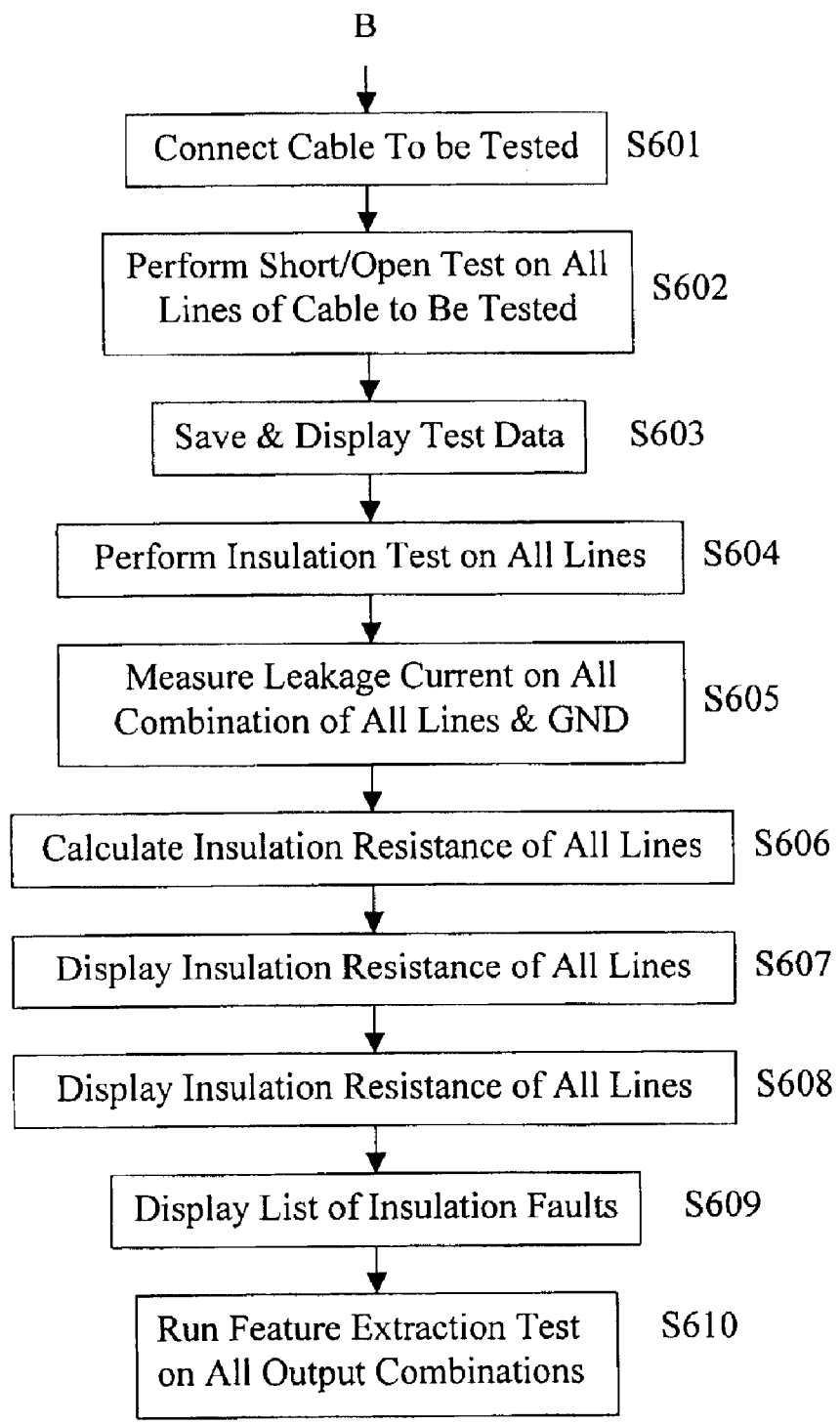
FIG. 6 shows the automatic operation of the aircraft multi-function wire and insulation tester provided by the present invention.

Referring to FIG. 4, when an automatic operation mode is selected, the process flow as shown in FIG. 6 is performed. As shown in FIG. 6, when the automatic mode is selected, the cable to be tested is connected to the connector 18 for testing in step 601. Preferably, only one end of the cable is connected to the connector 18 for performing the following test. Short/open test is then performed on the cable to be tested. When the cable comprises a plurality of lines, short/open test is performed on all lines thereof. The test result of the open/short test is displayed and saved in step S603. In step 604, the insulation test is performed on all lines of the cable. Preferably, the insulation test is also performed between every pair of the lines included in the cable. As mentioned above, the insulation test can be performed at a low voltage of about 10VDC. The leakage current $I_{leak}$ is measured on all combination of all lines of the cable and ground in step S605. In step S606, the insulation resistance of each line of the cable is calculated, where the insulation resistance $R_{ins}$ is equal to 10 divided by leakage current $I_{leak}$. That is, $R_{ins}=10/I_{leak}$. The insulation resistance is then saved, and a list of insulation faults is displayed in step S609. After the insulation faults is displayed and the above tests are performed, the feature extraction test on all line combinations is performed in step 610. The process for forming the feature extraction test is further illustrated in FIG. 6A.

Figure 6A:
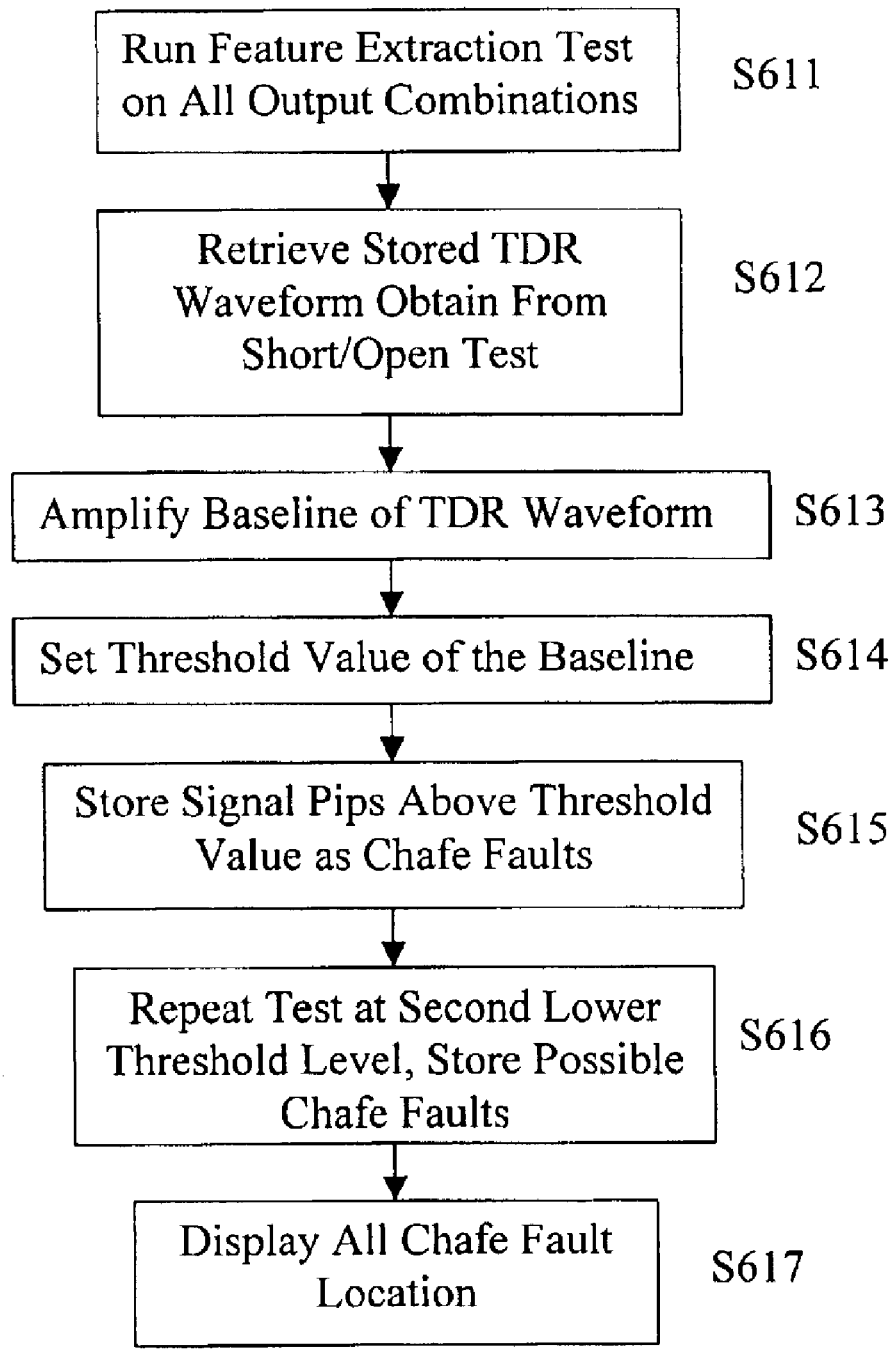
FIG. 6A shows the process flow of the feature extraction of waveform following the automatic operation as shown in FIG. 6.

As shown in FIG. 6A, to run feature extraction test, the TDR waveforms obtained from short/open test is obtained in step S612. The baseline of the TDR waveform is then amplified in step S613, and a threshold level of the baseline is set in step S614. In step S615, the signal pip appears above the threshold level is located and saved as the chafe value. In step S616, a second lower threshold level is set, and the pip appears above the second lower threshold level is stored as the potential chafe faults. The locations of all the chafe faults are then displayed and stored in step S617.

Indeed, each of the features and embodiments described herein can be used by itself, or in combination with one or more of other features and embodiment. Thus, the invention is not limited by the illustrated embodiment but is to be defined by the following claims when read in the broadest reasonable manner to preserve the validity of the claims.

What is claimed is:

1. An aircraft multi-function wire and insulation tester, comprising:

a time domain reflectometer, operative to perform time domain reflectometry test;

a digital multi-meter, operative to perform characteristic tests;

a connector, further comprising a plurality of output pins allowing a plurality of wires to be hooked up; and a matrix switch comprising a plurality input/output channels each with one end connected to a corresponding output pin of the connector, and the other end switched between the time domain reflectometer and the digital multi-meter, wherein N×(N−1)/2 wire paths are established when N output pins are selected to be tested.

2. The aircraft multi-function wire and insulation tester as recited in claim 1, wherein the time domain reflectometer, the digital multi-meter and the matrix switch are integrated into a computer.

3. The aircraft multi-function wire and insulation tester as recited in claim 2, wherein the computer comprises a laptop personal computer.

4. The aircraft multi-function wire and insulation tester as recited in claim 1, further comprising a graphic user interface providing a main menu allowing a user to select an operation mode and displaying current operation status thereof.

5. The aircraft multi-function wire and insulation tester as recited in claim 1, wherein the connector comprising 60 output pins.

6. The aircraft multi-function wire and insulation tester as recited in claim 5, wherein the matrix switch comprises 60 input/output channels.

7. The aircraft multi-function wire and insulation tester as recited in claim 1, further comprising a software allowing a cable engaged to the connector to be tested automatically.

8. The aircraft multi-function wire and insulation tester as recited in claim 1, wherein time domain reflectometer is operative to amplify a baseline of a time domain reflectometry waveform obtained from a cable under test, such that a chafe is located by detecting any pip over a threshold level of the baseline.

9. The aircraft multi-function wire and insulation tester as recited in claim 1, further comprising a processor integrated in the computer for controlling operation thereof.

10. The aircraft multi-function wire and insulation tester as recited in claim 1, further comprising:
    a display for showing an operation main menu and current operation status of the aircraft multi-function wire and insulation tester; and
    at least one input apparatus, allowing a user to select an operation mode.

11. The aircraft multi-function wire and insulation tester as recited in claim 1, wherein the digital multi-meter further comprises a function generator.

12. A method of testing a cable comprising a plurality of lines, comprising:
    connecting one end of each line of the cable to a time domain reflectometer;
    performing a time domain reflectometry test on each line of the cable;
    performing a time domain reflectometry test on each wire path established between every two of the lines of the cables;
    obtaining a time domain reflectometry waveform from at least one of the lines or the wire paths;
    amplifying a baseline of the time domain reflectometry waveform;
    setting a threshold level of the baseline; and
    locating any pip of the waveform over the threshold as a chafe.

13. The method as recited in claim 12, further comprising a step of performing a time domain reflectometry test on a plurality of wire paths established between the lines and ground.

14. The method as recited in claim 13, wherein the step of performing a time domain reflectometry test on each line further comprises determining a velocity of signal propagation and dielectric constant thereof.

15. The method as recited in claim 14, wherein the velocity of signal propagation is a function of dielectric constant.

16. The method as recited in claim 14, further comprising:
    obtaining the length D of a line to be tested;
    counting a time T for detecting an open circuit at an end of the line; and
    calculating the velocity of signal propagation of the line by dividing the length D by the speed of light and the time T.

17. The method as recited in claim 16, further comprising a step of determining the dielectric constant from the velocity of signal propagation.

18. The method as recited in claim 12, further comprising a step of performing characteristic test on each line of the cable, each of the wire paths between the lines, and/or a plurality of wire paths established between the lines and ground.

19. The method as recited in claim 12, further comprising a step of performing a low voltage insulation measurement on each wire path.

20. The method as recited in claim 19, wherein the low voltage insulation measurement is performed with a voltage no larger than 10VDC.

* * * * *